United States Patent
Yu et al.

(10) Patent No.: US 6,372,632 B1
(45) Date of Patent: Apr. 16, 2002

(54) METHOD TO ELIMINATE DISHING OF COPPER INTERCONNECTS BY THE USE OF A SACRIFICIAL OXIDE LAYER

(75) Inventors: Chen-Hua Yu, Hsin-Chu; Weng Chang, Taipei; Jih-Chung Twu, Chung-Ho; Tsu Shih, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/490,138

(22) Filed: Jan. 24, 2000

(51) Int. Cl.[7] .......................................... H01L 21/4763
(52) U.S. Cl. ...................... 438/634; 438/692; 438/690
(58) Field of Search ................................ 438/692, 634, 438/690

(56) References Cited

U.S. PATENT DOCUMENTS

| | | | |
|---|---|---|---|
| 5,244,534 A | 9/1993 | Yu et al. ...................... 156/636 |
| 5,356,513 A | 10/1994 | Burke et al. ................. 156/636 |
| 5,527,423 A | * 6/1996 | Neville et al. ............... 438/693 |
| 5,676,587 A | 10/1997 | Landers et al. ................ 451/57 |
| 5,818,110 A | 10/1998 | Cronin ........................ 257/775 |
| 5,821,168 A | 10/1998 | Jain ............................ 438/692 |
| 5,938,505 A | * 8/1999 | Morrison et al. .............. 451/36 |
| 6,001,730 A | * 12/1999 | Farkas et al. ................ 438/627 |
| 6,004,188 A | * 12/1999 | Roy .............................. 451/41 |
| 6,103,569 A | * 8/2000 | Teo et al. .................... 438/253 |
| 6,117,782 A | * 9/2000 | Lukanc et al. ............... 438/692 |
| 6,146,986 A | * 11/2000 | Wagganer .................... 438/618 |
| 6,150,272 A | * 11/2000 | Liu et al. .................... 438/692 |
| 6,235,633 B1 | * 5/2001 | Jang .......................... 438/675 |

OTHER PUBLICATIONS

Planarization of Dual–Damascene Post–Metal__CMP Structures. Lin, C.; CLevenger, L.; Schnabel, F.; Jamin, F.F.; Dobuzinski, D. Interconnect Technology 1999. IEEE International COnference, 1999. pp. 86–88.*

* cited by examiner

*Primary Examiner*—Amir Zarabian
*Assistant Examiner*—Beth E. Owens
(74) *Attorney, Agent, or Firm*—George O. Saile; Stephen B. Ackerman; Stephen G. Stanton

(57) ABSTRACT

A method of forming a planarized metal interconnect comprising the following steps. A semiconductor structure is provided. A low K dielectric layer is formed over the semiconductor structure. A sacrificial layer over is formed over the low K dielectric layer. The sacrificial layer and low K dielectric layer are patterned to form a trench within the sacrificial layer and low K dielectric layer. A barrier layer is formed over the sacrificial layer, lining the trench side walls and bottom. Metal is deposited on the barrier layer to form a metal layer filling the lined trench and blanket filling the sacrificial layer covered low K dielectric layer. The metal layer and the barrier layer are planarized, exposing the upper surface of the sacrificial layer. The sacrificial layer is removed to form a planarized metal interconnect.

33 Claims, 2 Drawing Sheets

METHOD TO ELIMINATE DISHING OF COPPER INTERCONNECTS BY THE USE OF A SACRIFICIAL OXIDE LAYER

BACKGROUND OF THE INVENTION

The copper (Cu) damascene method has become mainstream in the manufacture of copper interconnects in microminiaturized integrated circuits (IC). Currently, chemical mechanical polishing (CMP) of the copper layers includes an oxide buffing step to reduce dishing and erosion of the copper interconnects. Dishing causes reduced yields, unreliability and unacceptable performance. The deleterious effects of dished copper interconnects accumulate interconnect level by interconnect level. However, the oxide buffing step worsens the resistance ($R_s$) uniformity of the formed Cu interconnects and lines formed.

U.S. Pat. No. 5,818,110 to Cronin discloses an integrated circuit chip wiring structure, especially dynamic random access memory (DRAM), having crossover and contact capability without an interlock via layer, and a method of making same. This method permits selective exposure of the metal lines in a first insulative layer so that an electrical connection is made with the metal wire of the second insulative layer in the exposed areas. A multi-damascene approach is used to wire the first, thin metallization layer, then providing the second, thick metallization layer with first regions for metal wire and second regions for metal wire that are thinner than the first regions. A conformal layer coating is deposited that fills the second regions but not the first, wider regions. When an etch is then performed, the conformal layer in the wider first regions are completely etched away permitting exposure of the underlying thin metallization layer and formation of electrical connections in those first regions.

U.S. Pat. No. 5,244,534 to Yu et al. describes a two step chemical mechanical polishing (CMP), or planarization, technique in the formation of a planar metal plug flush with, or a convex metal plug that slightly protrudes from, an insulation layer in integrated circuit chips. The metal plug is preferably comprised of tungsten (W). Tungsten is deposited on a trenched insulation layer and the first CMP process that is selective to the W is used to remove W from the surface of the insulation layer and leaving slightly recessed W plugs within the trenches, or contact holes. The second CMP process is selective to the insulation layer and only slightly affects the W plugs to leave either: convex protruding W plugs or polished planar W plugs in the trenches.

U.S. Pat. No. 5,676,587 to Landers et al. describes a method of removing the tungsten (W) or copper (Cu) layer and a Ti/TiN (titanium/titanium nitride) or Ta/TaN (tantalum/tantalum nitride) liner film from the surface of an oxide layer which does not require an oxide touch-up step to essentially replanarize the surface of the oxide. The method entails removing the first film with a first removal process and stopping the removal before the first film is completely removed. The remaining first film is removed using a second removal process that is selective to the first film.

U.S. Pat. No. 5,356,513 to Burke et al. describes a method of producing a substantially planar surface overlying features of a semiconductor structure by the use of forming alternating layers of a hard polishing material and a soft alternating layer over the features of the semiconductor structure. The alternating hard and soft layers are then polished to form a substantially planar surface over the features.

U.S. Pat. No. 5,821,168 to Jain describes a process for forming a semiconductor device in which an insulating layer is nitrided and then covered by a thin adhesion layer before depositing a composite copper layer. This process eliminates the need for a separate diffusion barrier since a portion of the insulating layer is converted to form a diffusion barrier film and the adhesion layer reacts with the interconnect material resulting in strong adhesion between the composite copper layer and the diffusion barrier film formed on the insulating layer. After a copper seed layer is deposited by physical vapor deposition over the adhesion layer using a collimated sputtering chamber, the substrate is taken to an electroplating system where 6,000–15,000 Å of copper is plated over the copper seed layer forming a composite copper layer with the copper seed layer indistinguishable from the plated copper layer. CMP then removes the composite copper layer overlying the uppermost surface of the insulating layer.

SUMMARY OF THE INVENTION

Accordingly, it is an object of the present invention to provide an improved method of forming planar copper interconnects.

Another object of the present invention is to provide an improved method of forming planarized copper interconnects having increased resistance ($R_s$) uniformity and good planarity of the formed Cu interconnects and lines.

A further object of the present invention is to provide an improved method of forming planar copper interconnects by use of a sacrificial layer.

Yet another object of the present invention is to provide an improved method of forming planar copper interconnects by use of a first Cu layer selective CMP followed by a second sacrificial layer selective oxide buffing step.

Other objects will appear hereinafter.

It has now been discovered that the above and other objects of the present invention may be accomplished in the following manner. Specifically, a semiconductor structure is provided. A low K dielectric layer is formed over the semiconductor structure. A sacrificial oxide layer is formed over the low K dielectric layer. The sacrificial layer and low K dielectric layer are damascene patterned to form a trench within the sacrificial oxide layer and low K dielectric layer. A barrier layer is formed over the sacrificial oxide layer, lining the trench side walls and bottom. Metal is deposited on the barrier layer to form a metal layer filling the lined trench and blanket filling the sacrificial-oxide-layer-covered low K dielectric layer. The metal layer and the barrier layer are planarized, exposing the upper surface of the sacrificial layer. The sacrificial layer is then removed by oxide buffing to form a planarized metal interconnect.

BRIEF DESCRIPTION OF THE DRAWINGS

The features and advantages of the method of forming planar copper interconnects according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, processes etc. may be formed or accomplished by conventional methods known in the prior art.

Figure 1:
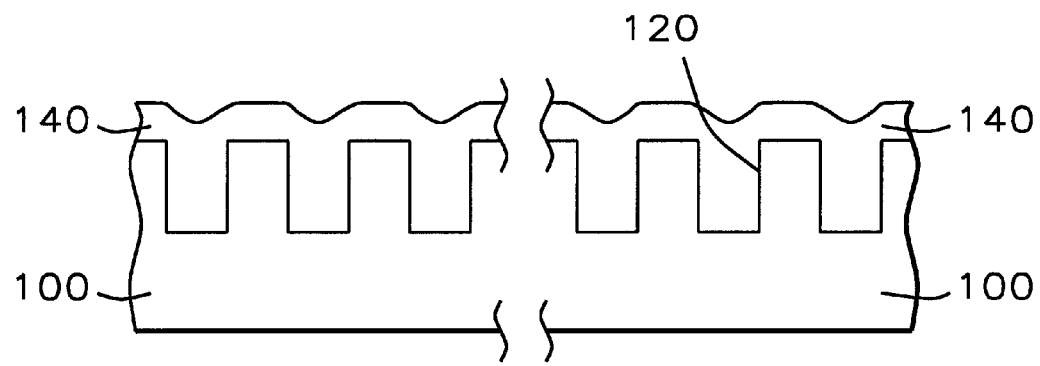
FIGS. 1 and 2 show a series of schematic cross-sectional diagrams illustrating a method of forming copper interconnects in integrated circuits known to the inventors.
Figure 2:
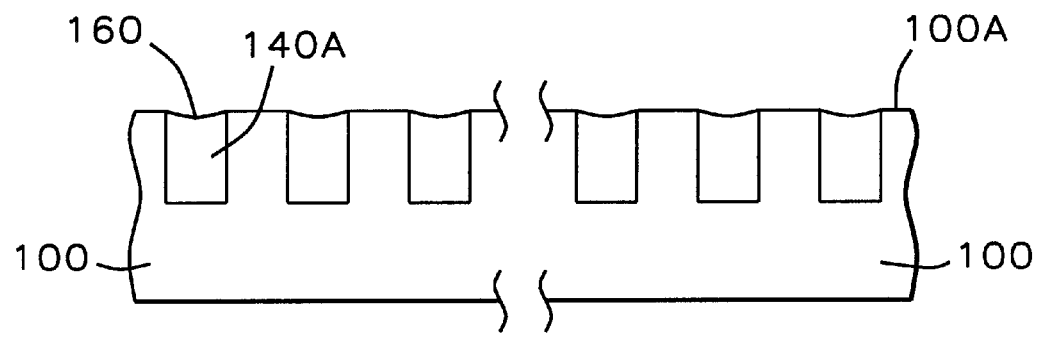

FIGS. 1 and 2 demonstrate a method known to the inventors of forming copper (Cu) interconnects in integrated circuits. This is not prior art for the purposes of determining the patentability of the present invention. This merely shows a problem found by the inventors.

As shown in FIG. 1, intermetal dielectric (IMD) layer 100 has trenches 120 formed therein. IMD layer 100 is usually comprised of undoped silicon glass (USG). The IMD layer may also be comprised of spin-on low K dielectric or chemical vapor deposition (CVD) low K (i.e. K<4.0) materials such as FSG, HSQ, SiLK, PAE-2, FLARE, black diamond, etc.

A copper layer 140 is deposited filling trenches 120 and blanket filling IMD layer 100. Copper layer 140 is then planarized to the upper surface 100a of IMD layer 100 by chemical mechanical polishing (CMP) and by oxide buffing. However, it is not easy to control uniformity using these processes and non-uniform, dished Cu interconnects 140a are formed as shown in FIG. 2 having concave upper surfaces 160. Although the oxide buffing is used to reduce dishing and erosion, it worsens the resistance ($R_s$) uniformity of the metal line because at different pattern density areas, CMP removes metal unevenly causing different metal thicknesses that will cause $R_s$ problem. These variations are caused by the different removal rates for the dielectric 100 and Cu 140 layers.

Dished copper interconnects 140a cause reduced yields, unreliability and unacceptable performance. The deleterious effects of non-uniform, dished Cu interconnects 140a accumulate interconnect level by interconnect level. The inventors have discovered that the following method eliminates, or minimizes, this undesired dishing 160 of the Cu interconnects and forms uniform Cu interconnects having good planarity and uniform resistance ($R_S$).

Figure 3:
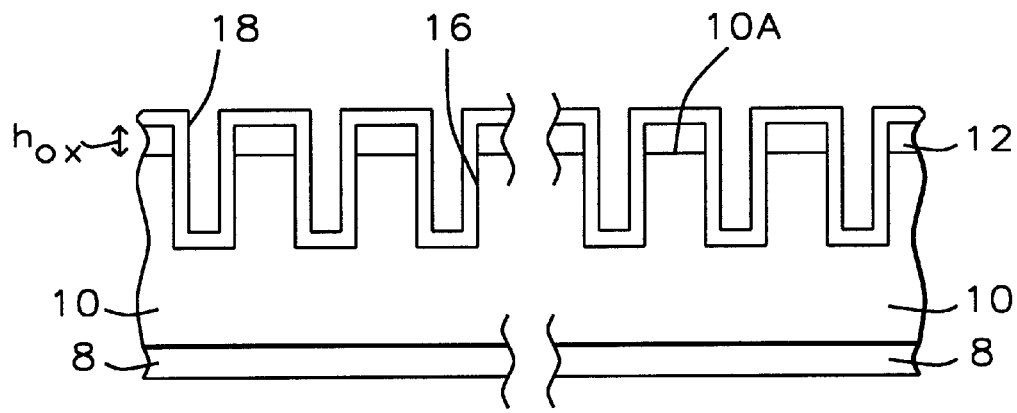
FIGS. 3 to 6 show a series of schematic cross-sectional diagrams illustrating the results of progressive stages in forming within a trench, within a semiconductor structure employed in integrated circuit fabrication, a planarized copper interconnect, in accordance with a preferred embodiment of the method of the present invention.

Accordingly as shown in FIG. 3, low K dielectric layer 10 having an upper surface 10a may be formed on semiconductor structure 8 by CVD or spin-on methods.

The CVD method creates a denser film, and is very popular, being used throughout the world. The spin-on method allows the use of low cost tools, provides good planarity, can form lower-K value materials, and causes less plasma damage.

If the CVD method is chosen to form dielectric layer 10, either methylsilane (1MS), two-methylsilane (2MS), three-methylsilane (3MS), four-methylsilane (4MS) or black diamond is used as the major gas; the compensatory gas includes Ar, $O_2$, $CH_4$, $N_2O$, $N_2$, $H_2$, etc.; with the plasma power similar to that used in regular oxide CVD processes although a post-CVD thermal anneal is required at about 300 to 450° C. for from about 10 to 200 minutes.

The spin-on method may be used to form a dielectric layer 10 comprised of SiLK, FLARE, PAE 2, HDSP, HSQ, etc., with: the spin speed adjusted to get a proper thickness of from about 2000 to 12,000 Å; baking between about 100 and 350° C. at 30 to 180 seconds (''); and curing required from about 350 to 450° C. for 15 to 120 minutes.

Semiconductor structure 8 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Low K dielectric layer 10, having upper surface 10a, may be comprised of: fluorine-doped $SiO_2$ (FSG); polyimide; polysilsequiozane (Si polymer); benzocyclobutene (BCB); parylene N; fluorinated polyimide; parylene P; amorphous Teflon®, or SiLK, FLARE, HOSP, HSQ, Black diamond, 4MS, 3MS, 2MS, or 1MS and is more preferably comprised of SiLK, HSQ, or Black diamond.

Low K dielectric layer 10 has a thickness of from about 1000 to 20,000 Å and more preferably 5000 Å thick. Using low K dielectric material for low K dielectric layer 10 improves circuit performance although it has a higher CMP rate than standard oxides and is more prone to dishing.

Sacrificial oxide layer 12, having a thickness $h_{ox}$ of from about 100 to 3000 Å and more preferably 2000 Å thick, is then formed over low K dielectric layer 10 by the spin-on or CVD methods, with the CVD method being the preferred method. Sacrificial oxide layer 12 may be formed from plasma enhanced oxide (PEOX), plasma enhanced tetraethylorthosilicate (PETEOS), or oxysiliconitride (OXSN) and is deposited from about 300 to 450° C., and more preferably from about 350 to 400° C.

Sacrificial oxide layer 12 and low K dielectric layer 10 are patterned and trenches 16 are formed therein as shown in FIG. 3. Trenches 16 are from about 1500 to 10,000 Å wide and more preferably about 2000 Å. Trenches 16 are preferably formed by plasma etching using either a DRM/TEL, LAM, or MXP/AMAT (Applied Material Corp.) etcher.

Barrier layer 18 is then formed over sacrificial oxide layer 12 and within trenches 16 covering the bottom and side walls of the trenches by ionized metal plasma including Ta or TaN, CVD or evaporation methods and more preferably by a Ta/TaN sputtering method using either AMT's Endura tool or Norellus'PVD tool. Barrier layer 18 may comprise tantalum (Ta), tantalum nitride (TaN), Ti, TiN and more preferably Ta/TaN. Barrier layer 18 prevents copper layer 14 from diffusing into low K dielectric layer 10 and permits copper layer 14 to adhere to low K dielectric layer 10. Barrier layer 16 ranges in thickness from about 2000 to 15,000 Å and is more preferred 5000 Å thick.

Figure 4:
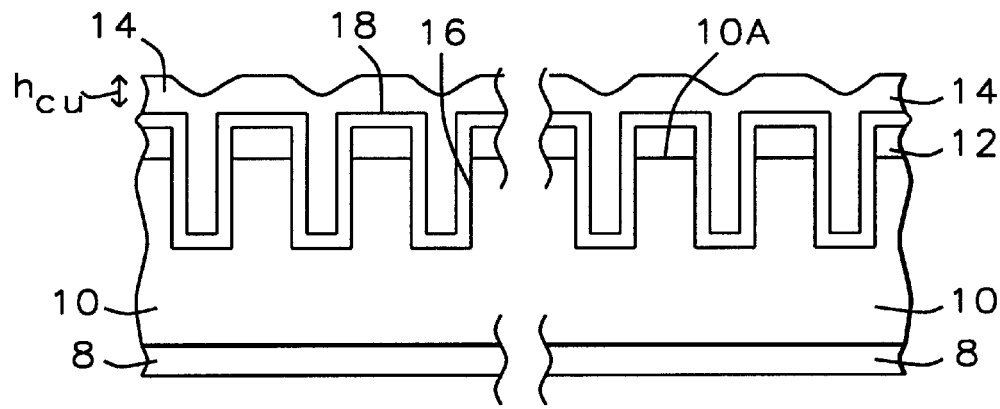

As shown in FIG. 4, metal layer 14, that may be formed of tungsten (W), silver (Ag), or gold (Au) and preferably copper (Cu), is then deposited over barrier layer 18, blanket filling sacrificial oxide layer 12 and filling trenches 16 by electroless deposition, electrochemical deposition (ECD), or CVD methods and more preferably by an ECD method. The preferred structure is a barrier layer 18 comprised of Ta/TaN with a Cu layer 14 formed by ECD.

The preferred embodiment consists of a two step CMP performed on a single tool, i.e. (1) a copper CMP of copper layer 14 and barrier layer 18, followed by (2) an oxide CMP, or oxide buffing, of sacrificial oxide layer 12. These two CMP steps have different slurries and parameters important to the invention.

Figure 5:
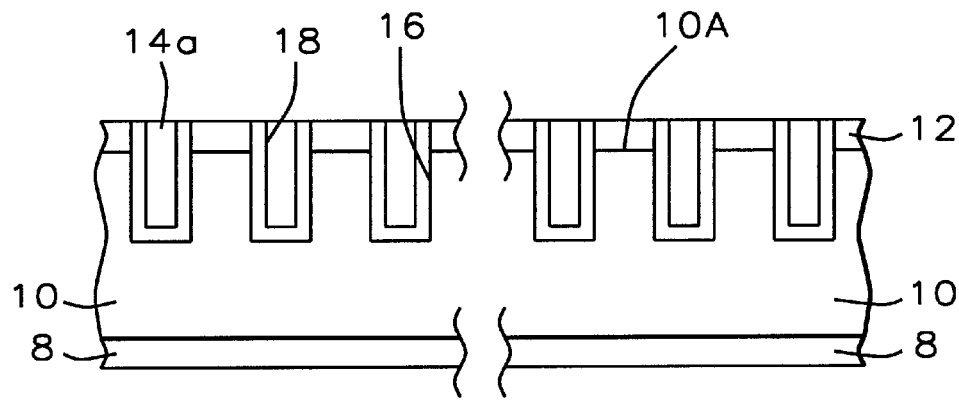

Copper layer 14 is then chemical-mechanical polished (CMP) to form the structure shown in FIG. 5, with over polish. The Cu CMP is selective to copper and sacrificial oxide layer 12 functions as a polish stop layer. The Cu CMP process is used with a Cu slurry.

Figure 6:
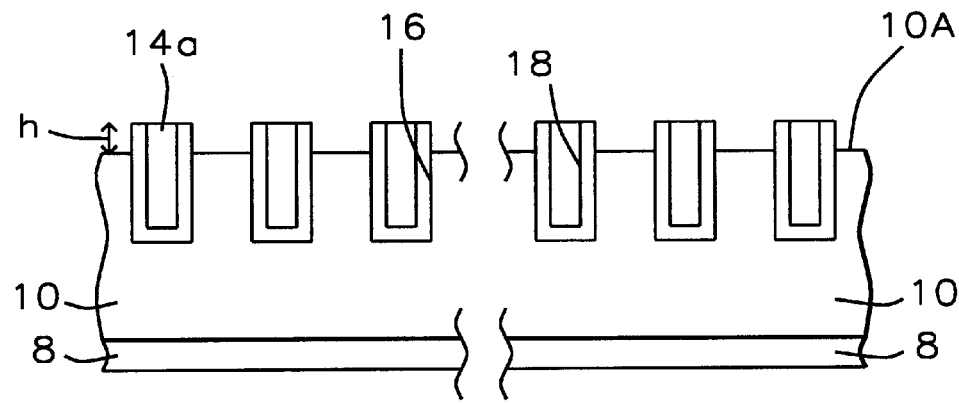

The structure shown in FIG. 5 is then subjected to oxide buffing using an oxide slurry selective to sacrificial oxide layer 12 to form the structure shown in FIG. 6. Low K dielectric layer 10 acts as a polish stop for this oxide buffing step.

The oxide buffing is conducted at the following parameters:
- slurry type—list composition of slurries used: $Al_2O_3$, $SiO_2$, and/or $CaO_2$ as the abrasive and $H_2O_2$ and an organic acid as oxidizer, surfactant; KOH;
- pH value of slurry: about 3 to 7;
- solid content in slurry: $Al_2O_3$, $SiO_2$, and/or $CaO_2$;
- slurry flow: from about 50–500 cc/minute
- process temperature: from about 10 to 70° C.;
- polish pressure: from about 1 to 7 psi;
- platen speed: from about 20 to 500 rpm; and
- pad type: polyurethane.

The respective selectivities for the copper CMP slurry and the oxide buffing slurry are demonstrated by the etching rate for each slurry:

| | Etching Rate (Å/min.) | | |
|---|---|---|---|
| | Copper layer 14 | Low K Dielectric 10 | Oxide layer 12 |
| Cu slurry: | 3000 | 20 | 0 |
| Oxide slurry: | 0 | 20 | 3000 |

The resulting structure has good planarity uniformity and good $R_s$ uniformity. The good Cu planarity uniformity achieved by the present invention provides for uniform Cu loss, and thus good $R_s$ uniformity.

While particular embodiments of the present invention have been illustrated and described, it is not intended to limit the invention, except as defined by the following claims.

We claim:

1. A method of forming a planarized metal interconnect, comprising the steps of:
    providing a semiconductor structure;
    forming a low K dielectric layer over said semiconductor structure, said low K dielectric layer having an upper surface;
    forming a sacrificial layer over said low K dielectric layer; said sacrificial layer having an upper surface;
    patterning said sacrificial layer and said low K dielectric layer to form a trench within said sacrificial layer and said low K dielectric layer;
    forming a barrier layer over said sacrificial layer and lining said trench side walls and bottom;
    depositing metal on said barrier layer to form a metal layer filling said lined trench and blanket filling said sacrificial-layer-covered low K dielectric layer;
    planarizing said metal layer and said barrier layer on said upper surface of said sacrificial layer using a first step chemical mechanical polishing process of a two step chemical mechanical polishing process, exposing said upper surface of said sacrificial layer; and
    removing said sacrificial layer using a second step chemical mechanical polishing process, having high selectivity to said sacrificial layer, of said two step chemical mechanical polishing process to form a planarized metal interconnect, wherein said sacrificial layer removal is performed by oxide buffing using a slurry including $SiO_2$, $Al_2O_3$, or $CaO_2$ solid abrasives; $H_2O_2$; a surfactant; and KOH.

2. The method of claim 1, wherein said barrier layer is comprised of Ta.

3. The method of claim 1, wherein said barrier layer is comprised of TaN.

4. The method of claim 1, wherein said low K dielectric layer is formed by a method selected from the group of spin-on and chemical vapor deposition (CVD).

5. The method of claim 1, wherein said low K dielectric layer is from about 1000 to 20,000 Å thick.

6. The method of claim 1, wherein said barrier layer is from about 100 to 800 Å thick.

7. The method of claim 1, wherein said sacrificial layer is from about 100 to 3000 Å thick.

8. The method of claim 1, wherein said trench is from about 1500 to 10,000 Å wide.

9. The method of claim 1, wherein said sacrificial layer is silicon oxide and said sacrificial layer removal is performed by oxide buffing at the following parameters: about 2 to 5 psi polish pressure; about 30 to 100 rpm platen speed; and 30 to 500 cc/minute slurry flow.

10. The method of claim 1, wherein said low K dielectric layer is selected from the group comprising: fluorine-doped $SiO_2$ (FSG), polyimide, polysilsesquiozane (Si polymer), benzocyclobutene (BCB), parylene N, fluorinated polyimide, parylene P, amorphous Teflon®, SiLK, FLARE, PAE-2, HOSP and Hydrogen-Silsesquioxane spin-on-glass (HSQ-SOG).

11. The method of claim 1, wherein said sacrificial layer is silicon oxide.

12. A method of forming a planarized metal interconnect, comprising the steps of:
    providing a semiconductor structure;
    forming a low K dielectric layer over said semiconductor structure, said low K dielectric layer having an upper surface and being from about 1000 to 3000 Å thick;
    forming a sacrificial oxide layer over said low K dielectric layer; said sacrificial oxide layer having an upper surface and being from about 100 to 3000 Å thick;
    patterning said sacrificial oxide layer and said low K dielectric layer to form a trench within said sacrificial oxide layer and said low K dielectric layer;
    forming a barrier layer over said sacrificial oxide layer and lining said trench side walls and bottom;
    depositing copper on said barrier layer to form a copper layer filling said lined trench and blanket filling said sacrificial-oxide-layer-covered low K dielectric layer;
    planarizing said copper layer and said barrier layer on said upper surface of said sacrificial oxide layer by a first step chemical mechanical polishing process of a two step chemical mechanical polishing process, exposing said upper surface of said sacrificial oxide layer; and
    removing said sacrificial oxide layer by oxide buffing that is a second step chemical mechanical polishing process, having high selectivity to oxide, of said two step chemical mechanical polishing process to form a planarized copper interconnect, wherein said sacrificial oxide layer removal is performed by oxide buffing at the following parameters: about 2 to 5 psi polish pressure; about 30 to 100 rpm platen speed; and 30 to 500 cc/minute slurry flow using a slurry including $SiO_2$, $Al_2O_3$, or $CaO_2$ solid abrasives; $H_2O_2$; a surfactant; and KOH.

13. The method of claim 12, wherein said low K dielectric layer is formed by a method selected from the group spin-on, CVD and CVD with thermal curing.

14. The method of claim 12, wherein said copper layer is from about 5000 to 15,000 Å thick.

15. The method of claim 12, wherein said sacrificial oxide layer is silicon oxide.

16. A method of forming a planarized metal interconnect, comprising the steps of:

providing a structure;

forming a low K dielectric layer over said structure, said low K dielectric layer having an upper surface;

forming a sacrificial oxide layer over said low K dielectric layer; said sacrificial oxide layer having an upper surface;

patterning said sacrificial oxide layer and said low K dielectric layer to form a trench within said sacrificial oxide layer and said low K dielectric layer;

forming a barrier layer over said sacrificial oxide layer and lining said trench side walls and bottom;

depositing metal on said barrier layer to form a metal layer filling said lined trench and blanket filling said sacrificial-oxide-layer-covered low K dielectric layer;

planarizing said metal layer and said barrier layer on said upper surface of said sacrificial oxide layer, exposing said upper surface of said sacrificial oxide layer; and removing said sacrificial oxide layer by oxide buffing using a slurry including: $SiO_2$, $Al_2O_3$, or $CaO_2$ solid abrasives; $H_2O_2$; a surfactant; and KOH, to form a planarized metal interconnect.

17. The method of claim 16, wherein said barrier layer is comprised of Ta.

18. The method of claim 16, wherein said barrier layer is comprised of TaN.

19. The method of claim 16, wherein said low K dielectric layer is formed by a method selected from the group of spin-on and chemical vapor deposition (CVD).

20. The method of claim 16, wherein said low K dielectric layer is from about 1000 to 20,000 Å thick.

21. The method of claim 16, wherein said barrier layer is from about 100 to 800 Å thick.

22. The method of claim 16, wherein said sacrificial layer is from about 100 to 3000 Å thick.

23. The method of claim 16, wherein said trench is from about 1500 to 10,000 Å wide.

24. The method of claim 16, wherein said sacrificial layer is silicon oxide and said sacrificial layer removal is performed by oxide buffing at the following parameters: about 2 to 5 psi polish pressure; about 30 to 100 rpm platen speed; and 30 to 500 cc/minute slurry flow.

25. The method of claim 16, wherein said low K dielectric layer is selected from the group comprising: fluorine-doped $SiO_2$ (FSG), polyimide, polysilsesquiozane (Si polymer), benzocyclobutene (BCB), parylene N, fluorinated polyimide, parylene P, amorphous Teflon®, SiLK, FLARE, PAE-2, HOSP and Hydrogen-Silsesquioxane spin-on-glass (HSQ-SOG).

26. A method of forming a planarized metal interconnect, comprising the steps of:

providing a structure;

forming a low K dielectric layer over said structure, said low K dielectric layer having an upper surface and being from about 1000 to 3000 Å thick;

forming a sacrificial silicon oxide layer over said low K dielectric layer; said sacrificial silicon oxide layer having an upper surface and being from about 100 to 3000 Å thick;

patterning said sacrificial silicon oxide layer and said low K dielectric layer to form a trench within said sacrificial silicon oxide layer and said low K dielectric layer;

forming a barrier layer over said sacrificial silicon oxide layer and lining said trench side walls and bottom;

depositing copper on said barrier layer to form a copper layer filling said lined trench and blanket filling said sacrificial-silicon-oxide-layer-covered low K dielectric layer;

planarizing said copper layer and said barrier layer on said upper surface of said sacrificial silicon oxide layer by chemical mechanical polishing, exposing said upper surface of said sacrificial silicon oxide layer; and removing said sacrificial silicon oxide layer by silicon oxide buffing to form a planarized copper interconnect; said silicon oxide buffing is performed at the following parameters: about 2 to 5 psi polish pressure; about 30 to 100 rpm platen speed; and 30 to 500 cc/minute slurry flow using a slurry comprised of including $SiO_2$, $Al_2O_3$, or $CaO_2$ solid abrasives; $H_2O_2$; a surfactant; and KOH.

27. The method of claim 26, wherein said low K dielectric layer is formed by a method selected from the group spin-on, CVD and CVD with thermal curing.

28. The method of claim 26, wherein said copper layer is from about 5000 to 15,000 Å thick.

29. A method of planarizing an oxide layer, comprising the steps of:

forming a metal layer over a structure;

forming an oxide layer over said metal layer;

planarizing said oxide layer by oxide buffing using an oxide slurry including $H_2O_2$.

30. The method of claim 29, wherein said the oxide buffing is conducted at the following parameters: about 2 to 5 psi polish pressure; about 30 to 100 rpm platen speed; and 30 to 500 cc/minute slurry flow.

31. The method of claim 29, wherein said oxide slurry further includes: $SiO_2$, $Al_2O_3$, or $CaO_2$; solid abrasives; a surfactant; and KOH; and the oxide buffing is conducted at the following parameters: about 2 to 5 psi polish pressure; about 30 to 100 rpm platen speed; and 30 to 500 cc/minute slurry flow.

32. The method of claim 29, wherein said oxide slurry further includes: $SiO_2$, $Al_2O_3$, or $CaO_2$; solid abrasives; a surfactant; and KOH.

33. The method of claim 29, wherein said oxide layer is comprised of silicon oxide.

* * * * *